United States Patent [19]
Dydyk et al.

[11] Patent Number: 4,494,087
[45] Date of Patent: Jan. 15, 1985

[54] COMBINER PROBE PROVIDING POWER FLATNESS AND WIDE LOCKING BANDWIDTH

[75] Inventors: Michael Dydyk, Scottsdale; Norman K. Enlow, Mesa; Joseph R. Tuzzolino, Phoenix, all of Ariz.

[73] Assignee: Motorola, Inc., Schaumburg, Ill.

[21] Appl. No.: 414,231

[22] Filed: Sep. 2, 1982

[51] Int. Cl.[3] .......................... H03B 5/18; H01P 7/06
[52] U.S. Cl. ......................... 331/107 DP; 331/107 P; 331/56; 331/96; 330/286; 330/56; 333/230; 333/227
[58] Field of Search ....................... 333/227, 230, 222; 331/96, 107 DP, 56, 101; 330/56, 286, 287; 324/57 Q, 58 R, 58 C, 59, 60 R, 61 P, 61 QS, 61 QL, 95, 126, 149, 158 P

[56] References Cited

U.S. PATENT DOCUMENTS

| | | | |
|---|---|---|---|
| 3,286,156 | 11/1966 | Barkes | 330/56 |
| 3,311,839 | 3/1967 | Rutulis | 330/4.9 |
| 3,601,723 | 8/1971 | Johnson | 333/230 X |
| 3,605,034 | 9/1971 | Rucker et al. | 330/56 X |
| 3,688,219 | 8/1972 | Havens | 331/107 C |
| 3,697,902 | 10/1972 | Louvel | 324/58 R X |
| 3,704,429 | 11/1972 | Sigmon | 330/56 X |
| 3,962,654 | 6/1976 | Corrons et al. | 331/56 |
| 4,340,870 | 7/1982 | Dydyk | 331/56 |

*Primary Examiner*—Eugene R. LaRoche
*Assistant Examiner*—Benny Lee
*Attorney, Agent, or Firm*—Eugene A. Parsons

[57] ABSTRACT

A distributed inductive reactance is coupled to a terminating impedance at the interface of a combiner probe with a resonant cavity. The distributed reactance is implemented by a metal insert having a cavity interface and having a coupling portion, which is coaxial with a cylindrical dielectric and with a cylindrical cavity in an end of the terminating impedance.

9 Claims, 8 Drawing Figures

COMBINER PROBE PROVIDING POWER FLATNESS AND WIDE LOCKING BANDWIDTH

BACKGROUND OF THE INVENTION

The present invention pertains in general to probes for cavity resonators and in particular to combiner probes having compensation for a discontinuity capacitance.

In recent years the dominant approach for power combining has been the use of a cylindrical cavity coupled to several microwave semiconductor devices. In this approach, as the number of diodes in a combiner increases, the output coupling coefficient, $\beta_{2N}$, has to increase according to a well established set of design equations as discussed in "Efficient Power Combining," by M. Dydyk, appearing in IEEE Transactions on Microwave Theory and Technique, July 1980, at pages 755–762. Specifically, the relationship for the coupling coefficient, $\beta_{2N}$, of a diode combiner having N diodes to the coupling coefficient, $\beta_{21ideal}$, for a single diode combiner is given by:

$$\beta_{2N}=N(1+\beta_{21ideal})-1 \quad (1)$$

In order to achieve tight coupling with more than one diode, M. Dydyk proposed a transformer in a probe assembly in his U.S. Pat. No. 4,340,870. However, for existing probes, the ability to couple to a cavity is accompanied by a limitation on maximum output coupling coefficients and a frequency detuning of the cavity resonant frequency due to a discontinuity capacitance at the probe site. Furthermore, this discontinuity capacitance can greatly reduce the effect of a transformer in the probe assembly.

In order to be able to achieve any desired coupling for efficient, multiple diode oscillators, the discontinuity capacitance at the probe site must be eliminated. The frequency shift due to such a discontinuity capacitance can be circumvented by using a cavity tuning screw, but in multiple cavity oscillators this is a tedious and inaccurate operation.

SUMMARY OF THE INVENTION

Accordingly it is an object of the present invention to provide a mechanism which allows multi-diode efficient oscillators to exhibit power flatness and a wide locking bandwidth.

It is a further object of the present invention to provide a new improved combiner probe which compensates for the discontinuity capacitance at the probe site.

Among the advantages of the present invention is the ability to achieve any desired coupling coefficient without desensitization.

A further advantage of the present invention is that it allows realization of multiple diode efficient oscillators having as many as 6 or more diodes.

In order to obtain the above and other objects and advantages the present invention involves a combiner probe which allows an oscillator to exhibit power flatness and a wide locking bandwidth and having a first end for insertion into a cavity and a second end. The combiner probe comprises a terminating impedance coupled to the first end of the probe and a distributed reactance coupled between the terminating impedance and the second end.

DESCRIPTION OF THE PREFERRED EMBODIMENT

Figure 1A:
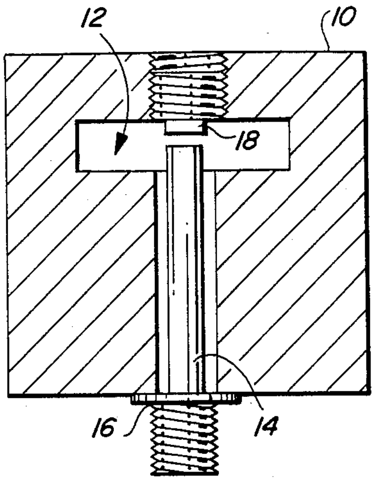
FIG. 1A (PRIOR ART)
FIG. 1A is a cross-sectional view of a prior art microwave network.

In a prior art combiner probe, as shown in FIG. 1A, a body element 10 surrounds a cavity 12. A first end of a coupling probe 14 is coupled to cavity 12 while a second end of coupling probe 14 is coupled to a coaxial connector 16. A tuning screw 18 projects into cavity 12 directly opposite probe 14.

As is clear to one skilled in the art, elements 10, 12, 14, 16 and 18 form a microwave network. The coupling coefficient, $\beta_{21}$, of this network is $$\beta_{21}=\frac{n_{21}^2 R_o}{Z_o}\left(\frac{1}{1+\left(\frac{X_p}{Z_o}\right)^2}\right) \quad (2)$$

Where:
$n_{21}$ = the transformation ratio,
$R_o$ = the resistance of the cavity,
$Z_o$ = the characteristic impedance, and
$X_p$ = the capacitive reactance of probe 14.

The resonant frequency, $f_r$, of this network in terms of the inherent resonant frequency, $f_o$, of cavity 12 is $$\left[2\left(\frac{f_r}{f_o}\right)^2-1\right]= \frac{X_p}{Z_o}\left\{-\frac{\beta_{21}}{Q_o}-\frac{X_p}{Z_o}\pm\sqrt{\left[1-\left(\frac{Z_o}{X_p}\right)^2+\frac{\beta_{21}X_p}{Q_oZ_o}\right]^2+4}\right\} \quad (3)$$

where: $Q_o$ = the unloaded quality factor of the cavity, and where all other variables are as defined above.

Figure 1B:
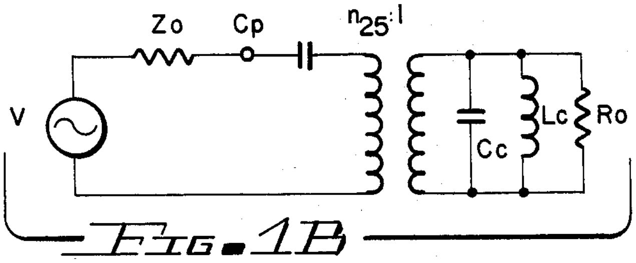
FIG. 1B (PRIOR ART)
FIG. 1B is an equivalent circuit of the network of FIG. 1A.

It should be noted that the capacitive reactance, $X_p$, has the following effects:

(a) It reduces $$\beta_{21ideal}=n_{21}^2R_o/Z_o$$

by a factor $$\{1+(X_p/Z_o)^2\}$$

and (b) It causes the cavity frequency to shift from its natural resonant frequency. An equivalent circuit of the microwave network of FIG. 1A appears in FIG. 1B wherein;

V=the generator voltage, $C_p$=the discontinuity capacitance of the probe, $C_c$=the capacitance of the cavity, $L_c$=the inductance of the cavity.

and where all other variables are as defined above.

$X_p$ has been described by M. Dydyk in his article "Efficient Power Combining," which appeared in IEEE Transactions on Microwave Theory and Technique, in July, 1980, at 755–762. The capacitive reactance, $X_d$, of a discontinuous inner conductor as been described by J. R. Whinnery, H. W. Jamieson, and T. E. Robbins, in "Coaxial Line Discontinuities," which appeared in the Proceedings of the IRE for November, 1944, at pages 695–709.

Figure 2:
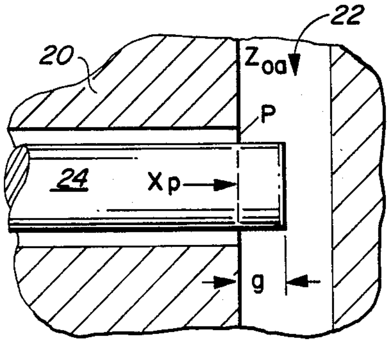
FIG. 2 (PRIOR ART)
FIG. 2 is a cross-sectional view of the region around a probe-cavity interface.

In FIG. 2 probe 24 has a capacitive reactance, $X_p$, looking to the right in FIG. 2 through a reference plane, P, at an interface with a cavity 22 within a body 20 due to its extension for a distance, g, into cavity 22, as is illustrated in FIG. 2.

Accordingly, $$X_p = \frac{1}{wC_p} = Z_{oa}\left[\frac{X_d - Z_{oa}\tan(kg)}{Z_{oa} + X_d\tan(kg)}\right] \quad (4)$$

where:

w=the radian frequency, $Z_{oa}$=the characteristic impedance of section, k=the phase propagation constant, g=the distance the probe extends into the cavity, and where all other variables are as defined above.

When a transformer is added to the network, as described in U.S. Pat. No. 4,340,870, but the discontinuity capacitance is not compensated for, the expression for the coupling coefficient is given by:

$$\beta_{21} = \left[\frac{Z_o}{Z_{XFMD}}\right]\beta_{21ideal}\left\{\frac{1}{1+\left[\frac{Z_o}{Z_{XFMD}}\ \frac{X_p}{Z_o}\right]^2}\right\} \quad (5)$$

where:

$Z_{XFMD}$=the transformer impedance, and where all other variables are as described above.

Figure 3:
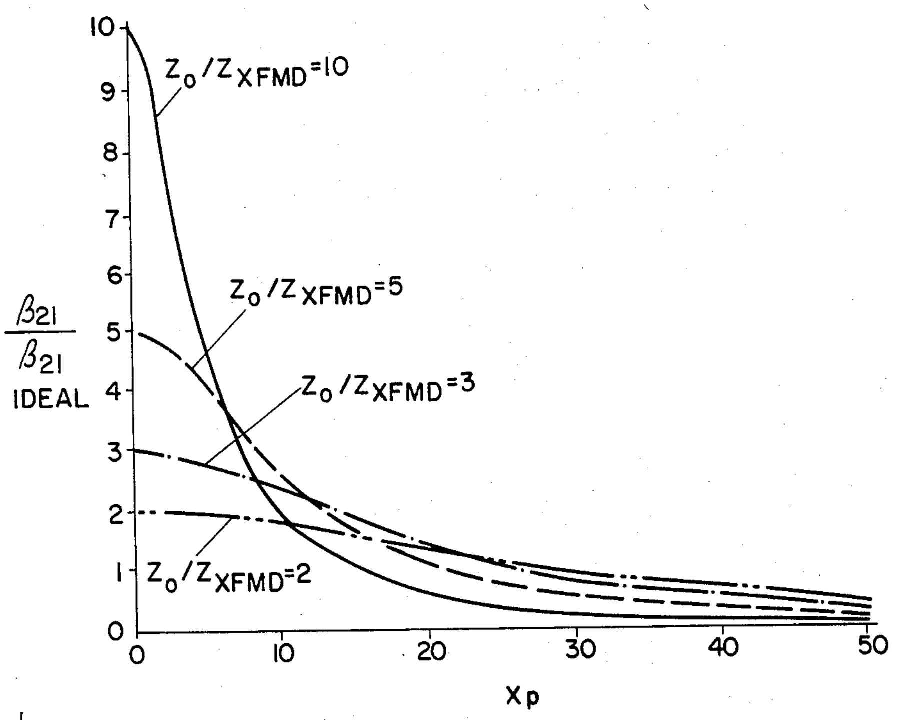
FIG. 3 is a plot depicting detrimental effects of the discontinuity capacitance.

FIG. 3 is a plot of Equation 5 which demonstrates the detrimental effects of the discontinuity capacitance and suggests the degree of compensation required.

Figure 4A:
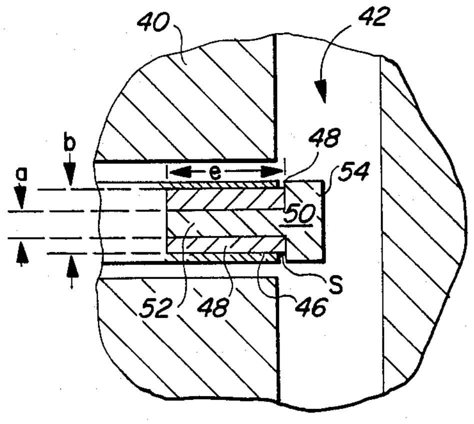
FIG. 4A is a cross-sectional view of a preferred embodiment of the combiner according to the present invention.

In a preferred embodiment of the combiner probe according to the present invention as illustrated in FIG. 4A, a body 40 contains a cavity 42. A cylindrical probe 44 has a drilled end 46 containing a metal insert 50 having a disc-shaped cavity interface 54 and a cylindrical coupling end 52. Coupling end 52 is surrounded by a tubular dielectric 48 so that hollow cylindrical portion 46, dielectric 48 and coupling end 52 are coaxial over a length l.

Metal insert 50 is in electrical contact with probe 44 through coupling portion 52 but cavity interface 54 is separated from drilled end 46 by a distance, s. An outer diameter, a, of coupling portion 52 is separated from an inner diameter, b, of hollow cylindrical portion 46 along a length, l, of the cylindrical dielectric 48.

Rod 44 may be a metal rod such as is commonly used as a combiner probe in the prior art but having a cylindrical cavity drilled in one end. Insert 50 may be a metal insert of the same material as probe 44. Dielectric 48 may be for example, air, Rexolite (T.M.) or Teflon (T.M.). Bodies, such as body 40, and cavities, such as cavity 42 are well known in the art and will not be described further.

The invention as illustrated in FIG. 4A may be described as a short circuited length, l, of lossy transmission line having a characteristic impedance $Z_a$ and being imbedded within a probe. The equivalent impedance of the network at the plane of the cavity is electrically in series with the capacitive discontinuity as described above. Hence, at resonance the inductive reactance, $X_a$, of the network cancels the discontinuity capacitance of the probe when $X_a$ is chosen according to the present invention so that $$X_a = X_p^* \quad (6)$$

where:

$X_p^*$=the conjugate of the capacitive reactance of interface 54.

Figure 4B:
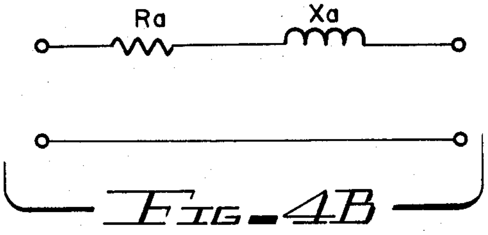
FIG. 4B is an equivalent circuit of the preferred embodiment of FIG. 4A.

Therefore, the present invention is implemented by coupling the network as illustrated in FIG. 4B to probe 44 at the interface of probe 44 with cavity 42 so that, in effect, $X_p$ is cancelled by $X_a$. Therefore, by using the probe of FIG. 4A, although loss is introduced, an inductor is created which resonates out capacitance in probe 44.

By using the present invention, the term in Equation 2 above containing the capacitive reactance variable, $X_p$, is eliminated and the equation for the ideal coupling coefficient, $\beta_{21ideal}$, is thereby obtained. In this way the optimum coupling coefficient for a given geometry of the sort required for a multiple diode cavity is achieved. Furthermore, the cavity resonant frequency shift due to the discontinuity capacitance is eliminated.

In FIG. 4B, $$R_a = Z_a \tanh\alpha l\left[\frac{1+\tan^2 kl}{1+\tanh^2\alpha l\,\tan^2 kl}\right] \quad (7)$$

and $$X_a = Z_a \tan kl\left[\frac{1-\tanh^2\alpha l}{1+\tanh^2\alpha l\,\tan kl}\right] \quad (8)$$

where the propagation constant is given by $$\gamma = \alpha + jk \quad (9)$$

For brass, $$\alpha = (6.59\times 10^{-10})\sqrt{f}\left(\frac{1}{b}\right)\left(1+\frac{b}{a}\right)\frac{60}{Z_a}\ nep/\text{cm} \quad (10)$$

where:

$R_a$=the resistance of the lossy line formed by the present invention, $Z_a$=the characteristic impedance of the line, f=the operating frequency, b=the coaxial line outer diameter, and a = the coaxial line inner diameter.

and where all other variables are as defined above.

Figure 5:
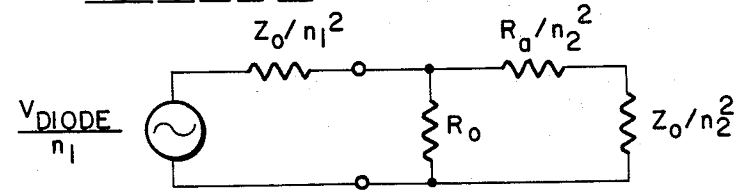
FIG. 5 is an equivalent circuit of a power combiner.

The present invention may be modeled as a lossy line. Because the loss mechanism varies as tangent function, materials having relatively low dissipation factors may be amplified significantly. Thus, without the judicious choice of $R_a$, the efficiency of a power combiner may suffer appreciably. The loss due to the resistance of the lossy line, $R_a$, may be determined from an equivalent circuit of a power combiner as shown in FIG. 5.

The insertion loss, I.L., may be expressed $$I.L. = 20 \log \left\{ \frac{1}{2} \left[ \frac{2\beta_1 + \beta_{21} - 1}{\sqrt{2\beta_1 \beta_{21}}} \right] \right\} + 20 \log \left[ 1 + \frac{Ra}{Zo} \left( \frac{1}{1 + \frac{\beta_{21}}{1 + 2\beta_1}} \right) \right] \quad (11)$$

where:

$\beta_1$ = the coupling coefficient of the diode to a cavity, and where $\beta_{21}$ is defined as for equation (2).

In practical multiple diode oscillators, as the number of diodes increases the coupling coefficients take on values such that $R_a$ should be limited to 2Ω or less to retain maximum efficiency.

Figure 6:
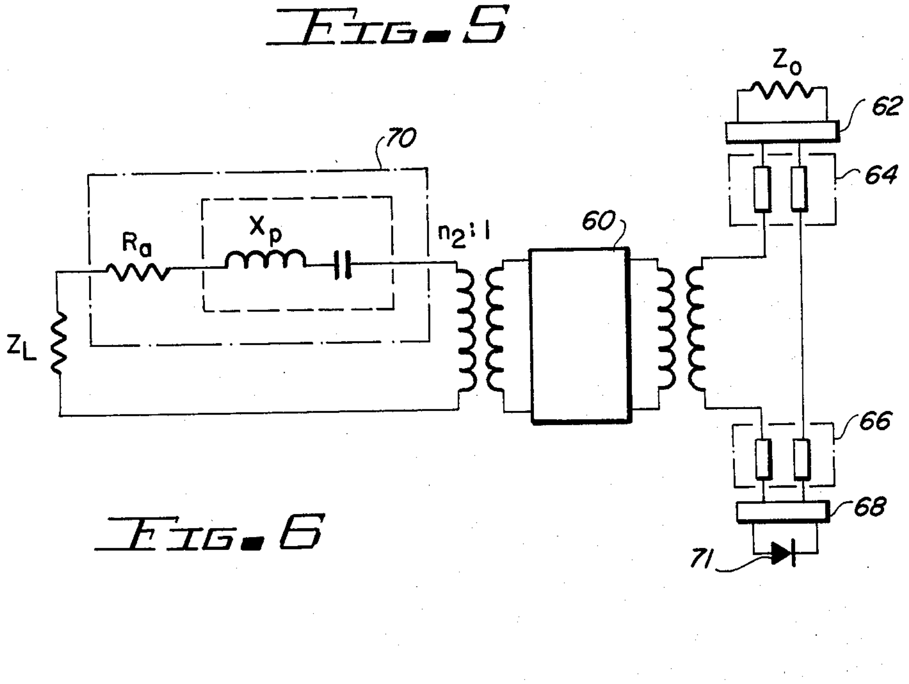
FIG. 6 is an equivalent circuit of a diode combiner having a combiner probe according to the present invention.

FIG. 6 depicts a more detailed equivalent circuit of a diode combiner having the probe compensation of the present invention. In the circuit of of FIG. 6, a combining cavity resonator 60 is coupled by way of a transmission line 64 to a stabilizing cavity 62 which is in turn coupled by a transmission line 66 to an equalizing network 68. An active element 70 is also coupled to equalizing network 68 which is in turn coupled to resonator 60. Resonator 60 is coupled to a combiner probe 70 according to the present invention.

The combination of $X_p$ and $X_c$, as shown in FIG. 6, forms a resonator which constitutes a double tuning mechanism for an oscillator. Hence, increases in locking bandwidth and in power flatness are realized over the prior art probes by using the present invention.

While the present invention has been described in terms of a preferred embodiment, further modifications and improvements will occur to those skilled in the art. We desire it to be understood, therefore, that this invention is not limited to the particular form shown and that we intend in the appended claims to cover all such equivalent variations which come within the scope of the invention described.

We claim:

1. A power output coupling probe, having a first end suitable for insertion into a resonant cavity and producing a capacitive reactance in conjunction with the resonant cavity, said probe comprising:
   a source of a distributed inductive reactance coupled to the first end for substantially cancelling the capacitive reactance.

2. The probe of claim 1 wherein said distributed inductive reactance comprises a short-circuited coaxial transmission line.

3. The probe according to claim 2 wherein said coaxial transmission line comprises a hollow cylindrical portion, a metal insert within said hollow cylindrical portion and a dielectric between said metal insert and said hollow cylindrical portion.

4. A resonant combiner comprising:
   a resonant cavity;
   an active device coupled to said cavity for providing oscillatory power in said cavity; and
   power output coupling probe means for coupling oscillatory power from said cavity to an external load, said probe means including an end positioned in said cavity whereby a capacitive reactance is produced, and said probe means further including an inductance providing an inductive reactance coupled to and substantially cancelling the capacitive reactance.

5. The resonant combiner according to claim 4 wherein said inductance comprises a coaxial transmission line.

6. The resonant combiner according to claim 5 wherein said coaxial transmission line comprises a hollow cylindrical portion, a metal insert within said hollow cylindrical portion and a dielectric between said metal insert and said hollow cylindrical portion.

7. A resonant combiner comprising:
   a resonant cavity;
   active device means coupled to said cavity for providing oscillatory power in said cavity; and
   at least one power combiner probe coupling oscillatory power from said cavity to an external load, said probe including an end positioned in said cavity whereby a capacitive reactance is produced, and said probe further including an inductance providing an inductive reactance coupled to and substantially cancelling the capacitive reactance.

8. The resonant combiner according to claim 7 wherein said inductance comprises a coaxial transmission line.

9. The resonant combiner according to claim 8 wherein said coaxial transmission line comprises a hollow cylindrical portion, a metal insert within said hollow cylindrical portion and a dielectric between said metal insert and said hollow cylindrical portion.

* * * * *